United States Patent
Sodo et al.

(10) Patent No.: US 10,298,149 B2
(45) Date of Patent: May 21, 2019

(54) POWER ELECTRONIC CONVERTER AND A METHOD FOR CONTROLLING IT

(71) Applicant: Vacon Oy, Vaasa (FI)

(72) Inventors: Nicklas Sodo, Vaasa (FI); Jussi Pouttu, Vaasa (FI)

(73) Assignee: Vacon Oy, Vaasa (FI)

( * ) Notice: Subject to any disclaimer, the term of this patent is extended or adjusted under 35 U.S.C. 154(b) by 0 days.

(21) Appl. No.: 16/077,621

(22) PCT Filed: Feb. 26, 2016

(86) PCT No.: PCT/EP2016/054076
§ 371 (c)(1),
(2) Date: Aug. 13, 2018

(87) PCT Pub. No.: WO2017/144114
PCT Pub. Date: Aug. 31, 2017

(65) Prior Publication Data
US 2019/0052190 A1  Feb. 14, 2019

(51) Int. Cl.
*H02M 1/32* (2007.01)
*H02M 7/5387* (2007.01)
*G01R 31/42* (2006.01)

(52) U.S. Cl.
CPC ........ *H02M 7/53871* (2013.01); *G01R 31/42* (2013.01); *H02M 1/32* (2013.01)

(58) Field of Classification Search
CPC ........ H02M 1/32; H02M 1/36; H02M 7/5387; H02M 7/53871; H02M 7/539; G01R 31/40; G01R 31/42
See application file for complete search history.

(56) References Cited

U.S. PATENT DOCUMENTS

| 7,034,501 B1 | 4/2006 | Thunes et al. |
| 8,259,426 B2* | 9/2012 | Xiao ................ H02M 1/32 361/88 |

(Continued)

FOREIGN PATENT DOCUMENTS

EP  2899559 A1  7/2015

OTHER PUBLICATIONS

International Search Report for PCT U.S. Appl. No. PCT/EP2016/054076 dated Nov. 11, 2016.

*Primary Examiner* — Matthew V Nguyen
(74) *Attorney, Agent, or Firm* — McCormick, Paulding & Huber LLP

(57) ABSTRACT

A power electronic converter comprises controllable switches (104-109) and a control system (110) for operating the controllable switches. The control system is configured to control the controllable switches so as to produce at least one test voltage pulse. The power electronic converter comprises a voltage sensor (111) for detecting a reflected voltage that is caused by a reflection of the test voltage pulse in an electric system connected to the power electronic converter. The control system is configured to control the operation of the power electronic converter at least partly in accordance with information based on the detection of the reflected voltage. The information can be used for example for determining forbidden voltage pulse lengths which would cause reflection-based over-voltages and/or for detecting faults such as short circuits and earth faults.

21 Claims, 6 Drawing Sheets

(56) References Cited

U.S. PATENT DOCUMENTS

| | | | |
|---|---|---|---|
| 8,797,768 B2* | 8/2014 | Asai | H02M 1/32 |
| | | | 363/56.04 |
| 2013/0088894 A1 | 4/2013 | Rozman et al. | |
| 2017/0005565 A1* | 1/2017 | Bai | H02M 3/33507 |
| 2017/0005570 A1* | 1/2017 | Nakashima | H02M 7/5387 |

* cited by examiner

POWER ELECTRONIC CONVERTER AND A METHOD FOR CONTROLLING IT

CROSS-REFERENCE TO RELATED APPLICATIONS

This application is a National Stage application of International Patent Application No. PCT/EP2016/054076, filed on Feb. 26, 2016, which is hereby incorporated by reference in its entirety.

TECHNICAL FIELD

The disclosure relates to a method for controlling a power electronic converter. Furthermore, the disclosure relates to a power electronic converter and to an electric drive. Furthermore, the disclosure relates to a computer program for controlling a power electronic converter.

BACKGROUND

In many cases, there can be a need for a cable between a power electronic converter and an electric machine so that the length of the cable can be as much as e.g. 300 meters or even more. The power electronic converter can be for example a frequency converter and the electric machine can be for example an alternating current motor and/or generator or a transformer. The reason for the need for the long cable can be for example a lack of room for the power electronic converter in the vicinity of the electric machine and/or ambient conditions unsuitable for the power electronic converter in the vicinity of the electric machine.

An inherent inconvenience related to a long cable between a power electronic converter and an electric machine is that the control of the electric machine is more challenging than in a case where a power electronic converter in the vicinity of an electric machine. The control is more challenging because finiteness of the signal propagation speed on the cable and reflections may cause situations where instantaneous voltages and currents at the power electronic converter differ from the corresponding instantaneous voltages and currents at the electric machine. A further inconvenience related to a long cable is that voltage reflections may cause over-voltages at the electric machine. In a disadvantageous case, the reflection-based over-voltages may damage the insulations of the electric machine. A traditional approach for reducing the reflection-based over-voltages is to set a lower limit to the temporal widths of voltage pulses produced by the power electronic converter. An inconvenience related to this approach is that the lower limit has to be sufficiently long, i.e. to include a sufficient safety margin, in order to achieve an acceptable operation in different situations. Therefore, in some cases, the application of the lower limit may unnecessarily degrade the quality of the control.

SUMMARY

The following presents a simplified summary in order to provide basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the present invention, there is provided a new power electronic converter that can be for example a frequency converter. A power electronic converter according to the invention comprises:
- electric terminals for connecting to an external electric system,
- controllable switches connected to the electric terminals,
- a control system for operating the controllable switches so as to control voltages of the electric terminals, and
- a voltage sensor connected to the electric terminals.

The control system is configured to:
- control one or more of the controllable switches so as to produce at least one test voltage pulse at the electric terminals,
- receive, from the voltage sensor, a sensor signal indicative of a reflected voltage detected from the electric terminals, the reflected voltage arriving from the external electric system and being caused by a reflection of the test voltage pulse, and
- control the operation of the power electronic converter at least partly in accordance with information based on the sensor signal.

In a power electronic converter according to an exemplifying and non-limiting embodiment of the invention, the information based on the sensor signal is used for determining allowed voltage pulse widths in order to avoid too high reflection-based over-voltages. In a power electronic converter according to an exemplifying and non-limiting embodiment of the invention, the above-mentioned information is used for detecting faults such as e.g. short circuits and earth faults. In a power electronic converter according to an exemplifying and non-limiting embodiment of the invention, the above-mentioned information is used for computing an estimate for the distance from the power electronic converter to a detected fault.

An electric drive according to the invention comprises:
- an electric machine,
- a power electronic converter according to the invention, and
- a cable between the electric machine and the power electronic converter.

The power electronic converter can be for example a frequency converter and the electric machine can be for example an alternating current motor and/or generator or a transformer.

In accordance with the present invention, there is provided also a new method for controlling a power electronic converter. A method according to the invention comprises:
- controlling one or more controllable switches of a power electronic converter so as to produce at least one test voltage pulse at electric terminals of the power electronic converter,
- receiving a sensor signal indicative of a reflected voltage detected from the electric terminals of the power electronic converter, the reflected voltage arriving from an electric system connected to the electric terminals of the power electronic converter and being caused by a reflection of the test voltage pulse, and
- controlling the operation of the power electronic converter at least partly in accordance with information based on the sensor signal.

In accordance with the invention, there is provided also a new computer program for controlling a power electronic converter. A computer program according to the invention comprises computer executable instructions for controlling a programmable control system of a power electronic converter to:

control one or more controllable switches of the power electronic converter so as to produce at least one test voltage pulse at electric terminals of the power electronic converter, receive a sensor signal indicative of a reflected voltage detected from the electric terminals of the power electronic converter, the reflected voltage arriving from an external electric system connected to the electric terminals of the power electronic converter and being caused by a reflection of the test voltage pulse, and control the operation of the power electronic converter at least partly in accordance with information based on the sensor signal.

In accordance with the invention, there is provided also a new computer program product. The computer program product comprises a non-volatile computer readable medium, e.g. a compact disc "CD", encoded with a computer program according to the invention.

A number of exemplifying and non-limiting embodiments of the invention are described in accompanied dependent claims.

Various exemplifying and non-limiting embodiments of the invention both as to constructions and to methods of operation, together with additional objects and advantages thereof, will be best understood from the following description of specific exemplifying embodiments when read in connection with the accompanying drawings.

The verbs "to comprise" and "to include" are used in this document as open limitations that neither exclude nor require the existence of also un-recited features. The features recited in the accompanied dependent claims are mutually freely combinable unless otherwise explicitly stated. Furthermore, it is to be understood that the use of "a" or "an", i.e. a singular form, throughout this document does not exclude a plurality.

BRIEF DESCRIPTION OF THE DRAWINGS

Exemplifying and non-limiting embodiments of the invention and their advantages are explained in greater detail below in the sense of examples and with reference to the accompanying drawings, in which.

DETAILED DESCRIPTION

The specific examples provided in the description below should not be construed as limiting the scope and/or the applicability of the accompanied claims. Lists and groups of examples provided in the description are not exhaustive unless otherwise explicitly stated.

Figure 1A:
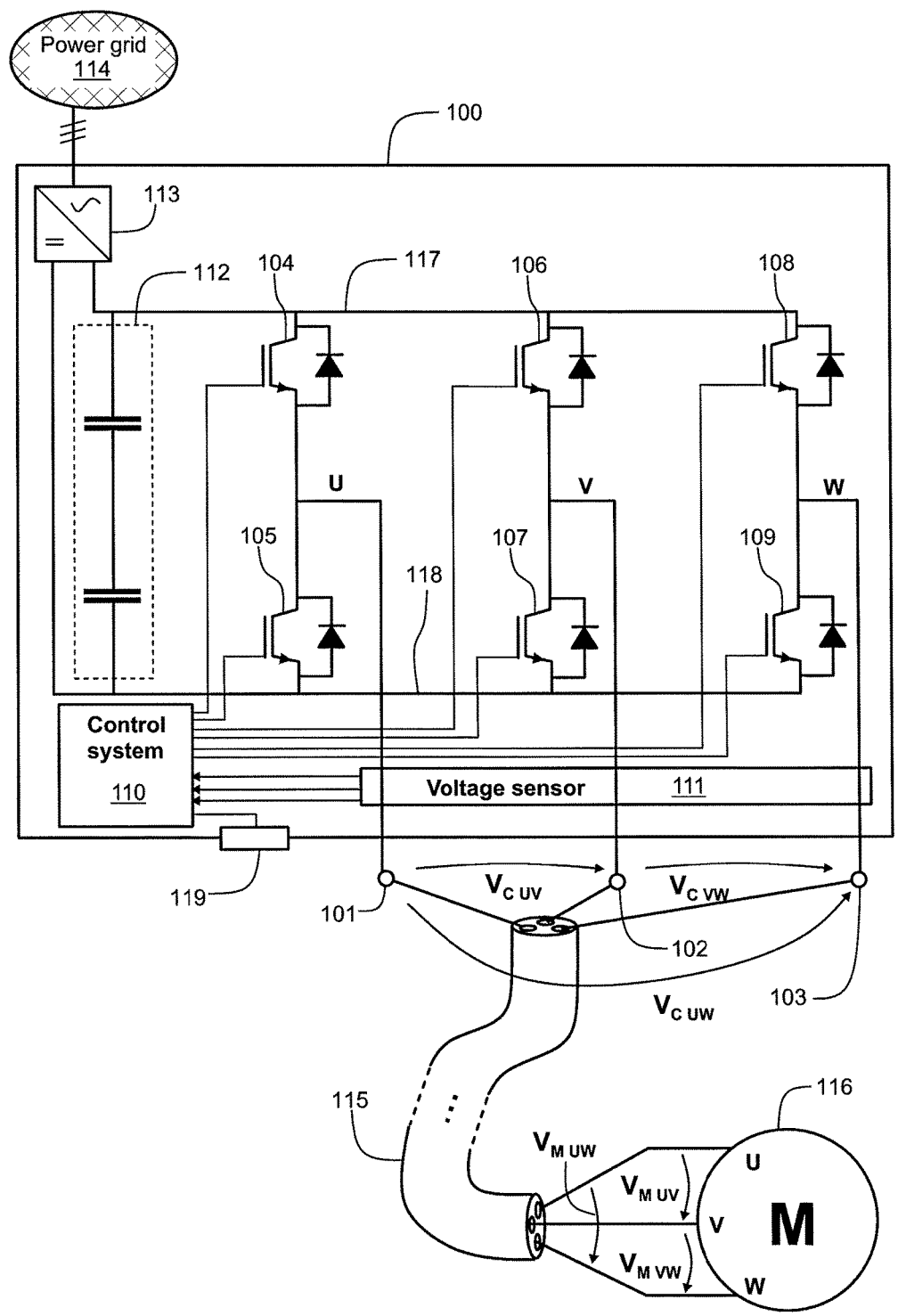
FIG. 1a shows a schematic illustration of an electric drive comprising a power electronic converter according to an exemplifying and non-limiting embodiment of the invention.

FIG. 1a shows a schematic illustration of an electric drive that comprises an electric machine 116, a cable 115, and a power electronic converter 100 according to an exemplifying and non-limiting embodiment of the invention. One end of the cable 115 is connected to the armature winding of the electric machine 116 and the other end of the cable 115 is connected to the power electronic converter 100. In the exemplifying case shown in FIG. 1a, the power electronic converter 100 is a frequency converter and the electric machine 116 is a three-phase alternating current machine that can be e.g. an induction machine, an electrically excited synchronous machine, or a permanent magnet synchronous machine.

The power electronic converter 100 comprises electric terminals 101, 102, and 103 for connecting to an external electric system. In this exemplifying case, the cable 115 and the electric machine 116 represent the electric system which is external from the viewpoint of the power electronic converter 100. The power electronic converter 100 comprises controllable switches 104, 105, 106, 107, 108, and 109 connected to the electric terminals 101-103 as illustrated in FIG. 1a. The controllable switches can be for example insulated gate bipolar transistors "IGBT", gate turn off thyristors "GTO", or some other suitable controllable switch components. In the exemplifying case shown in FIG. 1a, the power electronic converter 100 comprises a capacitive intermediate circuit 112 and a converter unit 113 for transferring electric energy between an alternating voltage power grid 114 and the capacitive intermediate circuit 112. As illustrated in FIG. 1a, the capacitive intermediate circuit 112 is connected to the controllable switches 104-109 via a positive rail 117 and a negative rail 118.

The power electronic converter 100 comprises a control system 110 for operating the controllable switches 104-109 so as to control voltages of the electric terminals 101-103. In FIG. 1a, the three phases of the power electronic converter 100 and of the electric machine 116 are denoted as U, V, and W, the voltages between the electric terminals 101-103 of the power electronic converter are denoted as $V_{C\ UV}$, $V_{C\ VW}$, and $V_{C\ UW}$, and the voltages between the electric terminals of the electric machine 116 are denoted as $V_{M\ UV}$, $V_{M\ VW}$, and $V_{M\ UW}$. The power electronic converter 100 comprises a voltage sensor 111 connected to the electric terminals 101-103. The voltage sensor 111 can be configured to detect the phase voltages of the electric terminals 101-103 with respect to the ground, or the voltage sensor can be configured to detect the phase-to-phase voltages, i.e. the main voltages, $V_{C\ UV}$, $V_{C\ VW}$, and $V_{C\ UW}$ between the electric terminals 101-103.

The control system 110 is configured to control one or more of the controllable switches 104-109 so as to produce at least one test voltage pulse at the electric terminals 101-103. The control system 110 is configured receive, from the voltage sensor 111, a sensor signal indicative of a reflected voltage detected from the electric terminals 101-103. The reflected voltage arrives from the cable 115 and is caused by a reflection of the above-mentioned test voltage pulse. The control system 110 is configured to control the operation of the power electronic converter 100 at least partly in accordance with information based on the sensor signal indicative of the reflected voltage.

A test voltage pulse can be produced for example between the phases U and V so that the controllable switches 104-107 are first in the non-conductive state, then the controllable switches 104 and 107 are switched to the conductive state for a time period corresponding to the temporal length of the test voltage pulse, and thereafter at least one of the controllable switches 104 and 107 is switched back to the non-conductive state. As at least one of the controllable switches 104-107 is in the non-conductive state after the test voltage pulse has been produced, the voltage sensor 111 is capable of measuring the reflected voltage from between the electric terminals 101 and 102 because at least one of the electric terminals 101 and 102 is in a high-impedance "Hi-Z" state and thus the intermediate circuit 112 does not determine the voltage between the electric terminals 101 and 102. The temporal length of the test voltage pulse can be for example from 0.5 microseconds to few, e.g. 3, microseconds. In many cases, the temporal length of the test voltage pulse is advantageously from 0.5 to 1.5 microseconds.

The information based on the reflected voltage can be utilized in many ways in the control of the power electronic converter 100. Some exemplifying and non-limiting ways to utilize the above-mentioned information are presented below.

In a power electronic converter according to an exemplifying and non-limiting embodiment of the invention, the control system 110 is configured to measure a time from the production of the test voltage pulse to the detection of the reflected voltage and to control the operation of the power electronic converter at least partly in accordance with the measured time. For example, the control system 110 can be configured to determine, on the basis of the measured time, allowed pulse widths for the voltages of the electric terminals 101-103 in order to avoid reflection-based over-voltages at the electric machine 116. The allowed pulse widths PW, i.e. allowed temporal lengths of voltage pulses, can be for example according to the following:

$$2N+1.5 < PW/T < 2N+2.5 \text{ or } PW/T \geq 4.5, \quad (1)$$

where T is the time measured from the production of the test voltage pulse to the detection of the reflected voltage and N is zero or a positive integer. The measured time T represents the round-trip time which is $2L/v$, where L is the physical length of the cable 115 and v is the propagation speed of the test voltage pulse and of the reflected voltage.

Figure 1B:
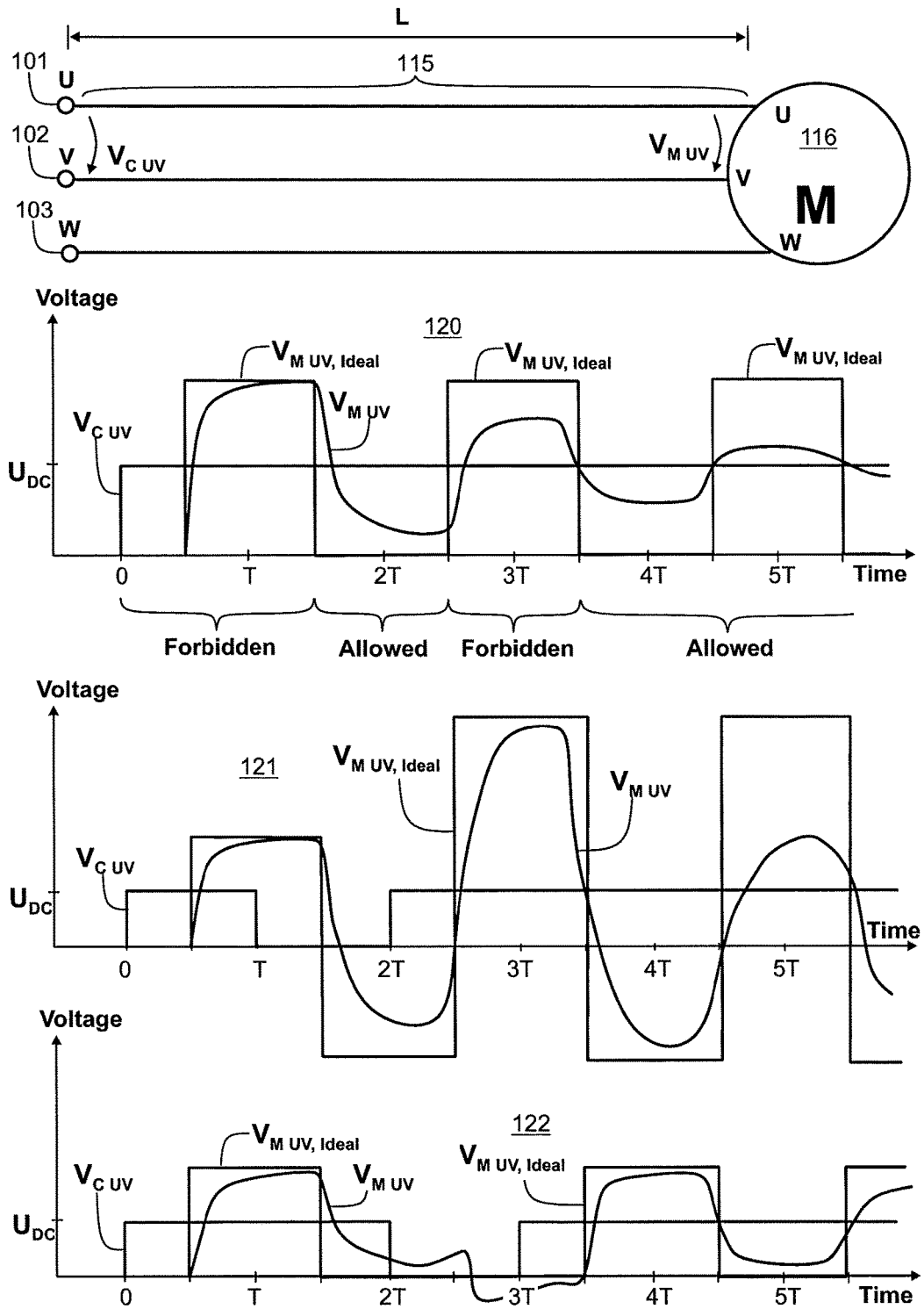
FIG. 1b illustrates principles utilized in a power electronic converter according to an exemplifying and non-limiting embodiment of the invention.

The principles utilized in the above-mentioned exemplifying and non-limiting embodiment of the invention are explained below with reference to FIG. 1b. FIG. 1b shows a schematic illustration of the electric machine 116, the cable 115, and the electric terminals 101-103. The graph 120 shows the waveform of the voltage $V_{M\ UV}$ between the phases U and V of the electric machine 116 in an exemplifying case where the voltage $V_{C\ UV}$ between the electric terminals 101 and 102 has an upward directed voltage step from 0 to $U_{DC}$ at the time instant 0. Furthermore, the graph 120 shows the waveform of voltage $V_{M\ UV,\ Ideal}$ which corresponds to a hypothetic case where the cable 115 is a lossless ideal transmission line and the electric machine 116 constitutes an ideal open end where the reflection coefficient r is +1. As can be seen from the waveforms of the voltages $V_{M\ UV}$ and $V_{M\ UV,\ Ideal}$ shown in the graph 120, the propagation time from the electric terminals 101-103 to the electric machine 116 is T/2 and thus the round-trip time is T. A graph 121 shows the waveforms of the voltages $V_{M\ UV,\ Ideal}$ and $V_{M\ UV}$ in an exemplifying case where the voltage $V_{C\ UV}$ has a first upward directed voltage step from 0 to $U_{DC}$ at the time instant 0, a downward directed voltage step from $U_{DC}$ to 0 at the time instant T, and a second upward directed voltage step from 0 to $U_{DC}$ at the time instant 2T. As can be seen from the waveform of $V_{M\ UV,\ Ideal}$ shown in the graph 121, the voltage oscillations occurring at the electric machine 116 and caused by the first and second upward directed voltage steps are constructively superimposed. The voltage oscillation occurring at the electric machine 116 and caused by the above-mentioned downward directed voltage step has such a temporal phase that it does not cancel the above-mentioned voltage oscillations caused by the above-mentioned upward directed voltage steps. Thus, reflection-based over-voltages may occur at the electric machine 116. A graph 122 shows the waveforms of the voltages $V_{M\ UV,\ Ideal}$ and $V_{M\ UV}$ in an exemplifying case where the voltage $V_{C\ UV}$ has a first upward directed voltage step from 0 to $U_{DC}$ at the time instant 0, a downward directed voltage step from $U_{DC}$ to 0 at the time instant 2T, and a second upward directed voltage step from 0 to $U_{DC}$ at the time instant 3T. In this exemplifying case, the voltage oscillation occurring at the electric machine 116 and caused by the first upward directed voltage step is cancelled by the voltage oscillation caused by the downward directed voltage step. Thus, the peak values of the voltage $V_{M\ UV}$ at the electric machine 116 are smaller than those in the case illustrated by the graph 121.

In order to avoid the adverse effect illustrated by the graph 121, a voltage pulse between the electric terminals 101 and 102 and starting at the time instant 0 should not end on areas marked with the label "Forbidden" in the graph 120. Instead, the voltage pulse should end on the areas marked with the label "Allowed." The area where the time is greater than 4.5T is marked as "Allowed" because the oscillation of the voltage $V_{M\ UV}$ is assumed to be attenuated so much that the adverse effect illustrated by the graph 121 does not take place in a harmful extent. The areas marked as "Allowed" in the graph 121 correspond to allowed pulse widths which fulfill the above-presented equation (1). Therefore, the minimum pulse width does not need to be e.g. about ≈5T based on the attenuation of oscillations but it is also possible to use shorter pulse widths from 1.5T to 2.5T. Thus, there is no need to degrade the quality of the control of the electric machine 116 in the same way as in cases where the reflection-based over-voltages are avoided by using a minimum pulse width which has a safety margin sufficient for different situations.

In a power electronic converter according to an exemplifying and non-limiting embodiment of the invention, the control system 110 is configured to use the sensor signal indicative of the reflected voltage for detecting faults such as for example short circuits, earth faults, and conductor breaks. For example, the control system 110 can be configured to set a data interface 119 of the power electronic converter 100 to indicate a fault on the cable 115 and/or the electric machine 116 in response to a situation in which a first arriving edge of the reflected voltage has an opposite polarity with respect to the polarity of the test voltage pulse. This approach is suitable for detecting short circuits and earth faults whose impedance is smaller than the characteristic impedance of the cable 115. Thus, the reflection coefficient r at the fault is negative and thereby the first arriving edge of the reflected voltage has an opposite polarity with respect to the test voltage pulse. The control system 110 can be further configured to compute an estimate for the distance from the power electronic converter 100 to the fault on the basis of a pre-determined parameter indicative of the propagation speed v of the test voltage pulse and the time t measured from production of the test voltage pulse to detection of the reflected voltage. The estimate of the distance is $vt/2$.

In a power electronic converter according to an exemplifying and non-limiting embodiment of the invention, the control system 110 is configured to control the controllable switches 104-109 so as to produce test voltage pulses between different ones of the electric terminals 101-103 and to detect differences between reflected voltages detected from between the different ones of the electric terminals. For example, a first test voltage pulse can be produced between the phases U and V, i.e. between the electric terminals 101 and 102, a second test voltage pulse can be produced between the phases V and W, and a third test voltage pulse can be produced between the phases U and W. Differences between waveforms of the reflected voltages corresponding to the test voltage pulses, i.e. asymmetry, are indicative of a fault in the cable 115 and/or in the electric machine 116. The control system is configured to set the data interface 119 to indicate a fault for example in response to a situation in which differences in amplitudes of the reflected voltages and/or differences in oscillating frequencies of the reflected voltages exceed pre-determined threshold values. For a further example, the control system 110 can be configured to set the data interface 119 to indicate a fault on a phase U, V, or W in response to a situation in which a time measured from the production of the test voltage pulse at the phase under consideration to the detection of the reflected voltage from the phase under consideration is shorter than a corresponding time measured for at least one of the other phases. The situation of the kind described above indicates that there is a fault in the cable 115. The fault can be an earth fault, a short circuit between two phases, or a break in one or two phase conductors. The control system 110 can be configured to compute an estimate for the distance from the power electronic converter 110 to the fault on the basis of the time measured for the phase under consideration and a pre-determined parameter indicative of the propagation speed of the test voltage pulses.

The fault detections of the kind described above can be carried out for example during commissioning of the electric drive and/or during a break in the normal operation of the electric drive.

The control system 110 of the power electronic converter 100 may comprise one or more processor circuits, each of which can be a programmable processor circuit provided with appropriate software, a dedicated hardware processor such as for example an application specific integrated circuit "ASIC", or a configurable hardware processor such as for example a field programmable gate array "FPGA". Furthermore, the control system 110 may comprise memory which can be e.g. random access memory "RAM". Furthermore, the control system 110 may comprise driver circuits for supplying control signals to the controllable switches 104-109.

The power electronic converter 100 described above with reference to FIGS. 1a and 1b can be deemed to be a power electronic converted that comprises:
electric terminals for connecting to an external electric system,
controllable switches connected to the electric terminals,
means for operating the controllable switches so as to control voltages of the electric terminals,
means connected to the electric terminals and for detecting one or more of the voltages of the electric terminals,
means for controlling one or more of the controllable switches so as to produce at least one test voltage pulse at the electric terminals, and
means for controlling the operation of the power electronic converter at least partly in accordance with information based on a sensor signal indicative of a reflected voltage detected from the electric terminals, the reflected voltage arriving from the external electric system and being caused by a reflection of the test voltage pulse.

A power electronic converter according to an exemplifying and non-limiting embodiment of the invention comprises means for measuring a time from the production of the test voltage pulse to the detection of the reflected voltage and for controlling the operation of the power electronic converter at least partly in accordance with the measured time.

A power electronic converter according to an exemplifying and non-limiting embodiment of the invention comprises means for determining, on the basis of the measured time, allowed pulse widths for voltages of the electric terminals of the power electronic converter. The allowed pulse widths can be for example according to the above-presented equation (1).

A power electronic converter according to an exemplifying and non-limiting embodiment of the invention comprises means for setting a data interface of the power electronic converter to indicate a fault on the external electric system in response to a situation in which a first arriving edge of the reflected voltage has an opposite polarity with respect to the polarity of the test voltage pulse.

A power electronic converter according to an exemplifying and non-limiting embodiment of the invention comprises means for computing an estimate of the distance from the power electronic converter to the fault on the basis of a pre-determined parameter indicative of the propagation speed of the test voltage pulse and a time measured from the production of the test voltage pulse to the detection of the reflected voltage.

A power electronic converter according to an exemplifying and non-limiting embodiment of the invention comprises means for controlling the controllable switches so as to produce test voltage pulses at different ones of the electric terminals and for detecting differences between reflected voltages detected from the different ones of the electric terminals.

A power electronic converter according to an exemplifying and non-limiting embodiment of the invention comprises means for setting the data interface of the power electronic converter to indicate a fault on a part of the external electric system connected to a first one of the electric terminals in response to a situation in which a time measured from the production of the test voltage pulse at the first one of the electric terminals to the detection of the reflected voltage from the first one of the electric terminals is shorter than the corresponding time measured for at least one of the other ones of the electric terminals.

A power electronic converter according to an exemplifying and non-limiting embodiment of the invention comprises means for computing an estimate of the distance from the power electronic converter to the fault on the basis of the time measured for the first one of the electric terminals and a pre-determined parameter indicative of the propagation speed of the test voltage pulses.

Figure 2A:
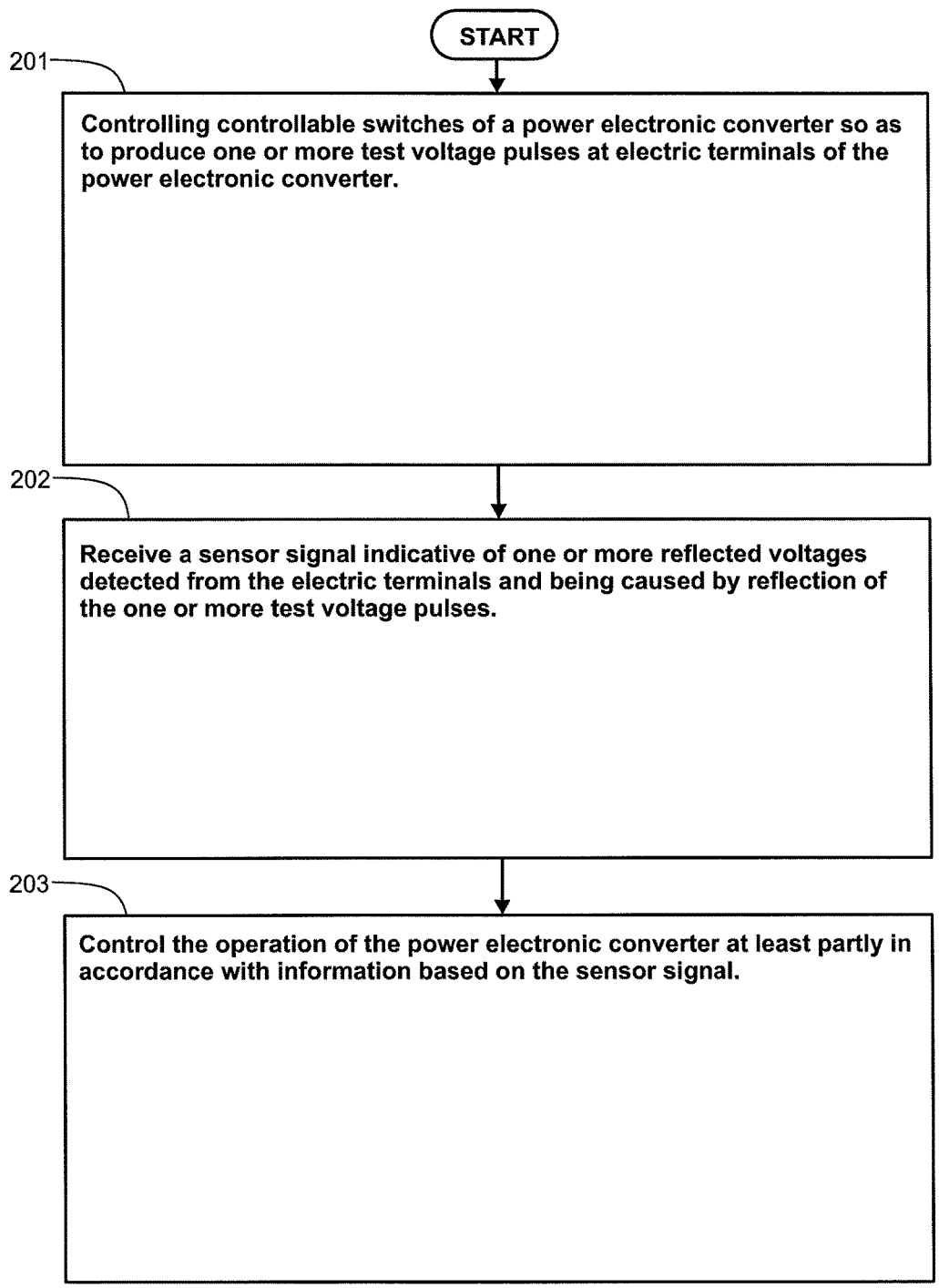
FIG. 2a shows a flowchart of a method according to an exemplifying and non-limiting embodiment of the invention for controlling a power electronic converter.

FIG. 2a shows a flowchart of a method according to an exemplifying and non-limiting embodiment of the invention for controlling a power electronic converter. The method comprises the following actions:
action 201: controlling one or more controllable switches of the power electronic converter so as to produce at least one test voltage pulse at electric terminals of the power electronic converter,
action 202: receiving a sensor signal indicative of a reflected voltage detected from the electric terminals of the power electronic converter, the reflected voltage arriving from an electric system connected to the electric terminals of the power electronic converter and being caused by a reflection of the test voltage pulse, and action 203: controlling the operation of the power electronic converter at least partly in accordance with information based on the sensor signal.

Figure 2B:
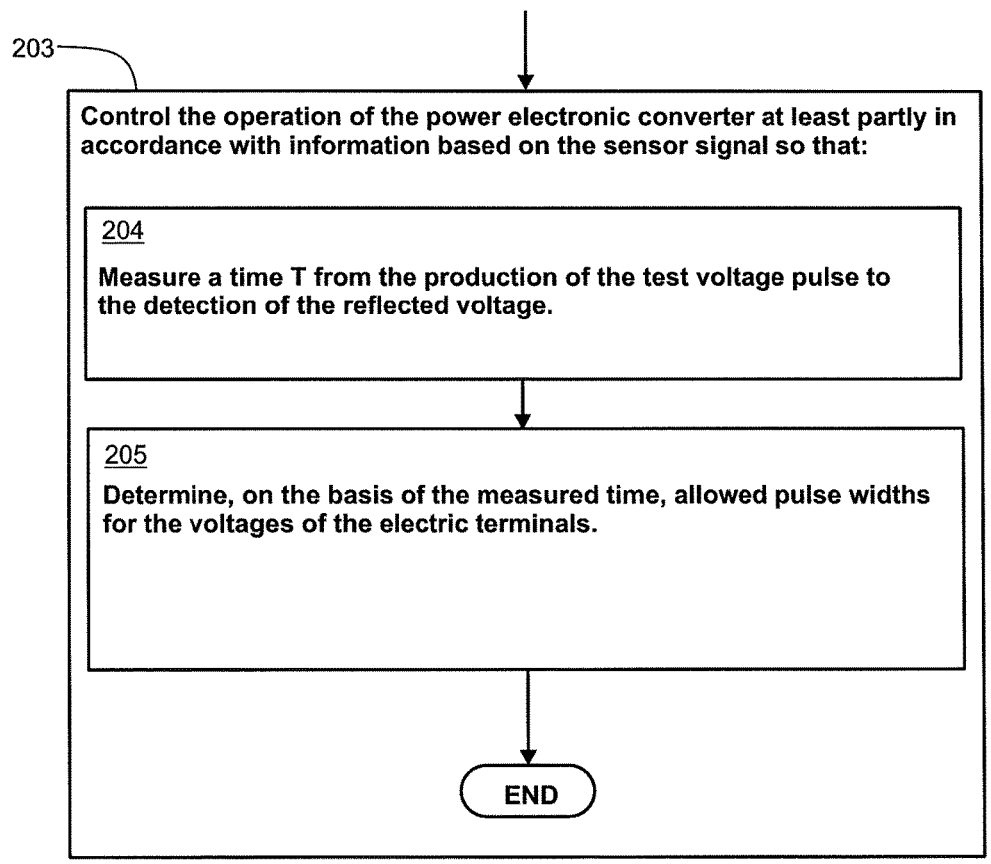
FIG. 2b shows a part of a flowchart of a method according to an exemplifying and non-limiting embodiment of the invention for controlling a power electronic converter.

FIG. 2b illustrates the above-mentioned action 203 in a method according to an exemplifying and non-limiting embodiment of the invention. In this exemplifying and non-limiting embodiment of the invention, the action 203 comprises the following sub-actions:

sub-action 204: measuring a time from the production of the test voltage pulse to the detection of the reflected voltage, and sub-action 205: determining, on the basis of the measured time, allowed pulse widths for voltages of the electric terminals of the power electronic converter, the allowed pulse widths can be e.g. according to the above-presented equation (1).

Figure 2C:
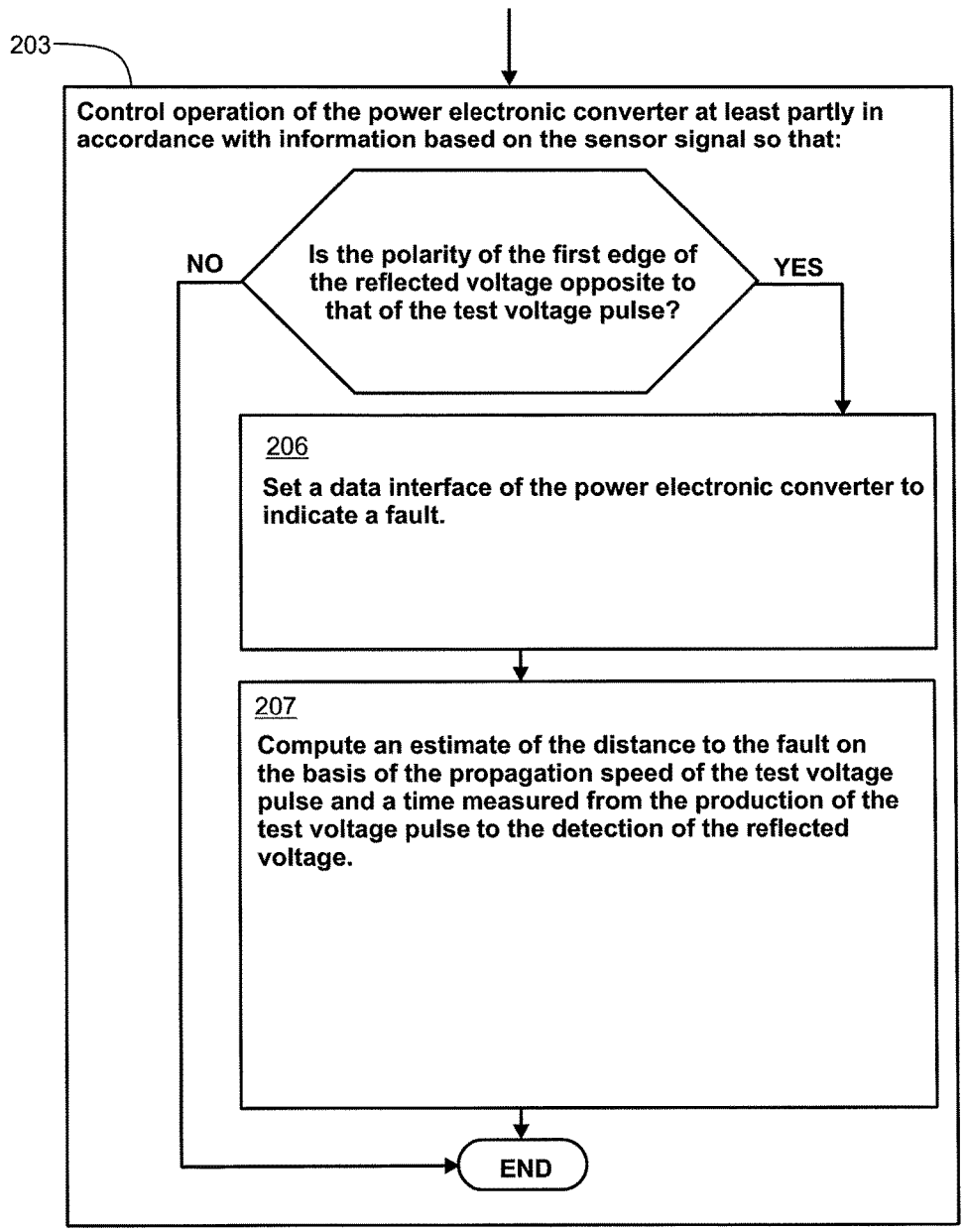
FIG. 2c shows a part of a flowchart of a method according to an exemplifying and non-limiting embodiment of the invention for controlling a power electronic converter.

FIG. 2c illustrates the above-mentioned action 203 in a method according to an exemplifying and non-limiting embodiment of the invention. In this exemplifying and non-limiting embodiment of the invention, the action 203 comprises the following sub-actions:

sub-action 206: setting a data interface of the power electronic converter to indicate a fault on the external electric system in response to a situation in which a first arriving edge of the reflected voltage has an opposite polarity with respect to the polarity of the test voltage pulse, and sub-action 207: computing an estimate for the distance from the power electronic converter to the fault on the basis of a pre-determined parameter indicative of the propagation speed of the test voltage pulse and a time measured from the production of the test voltage pulse to the detection of the reflected voltage.

Figure 2D:
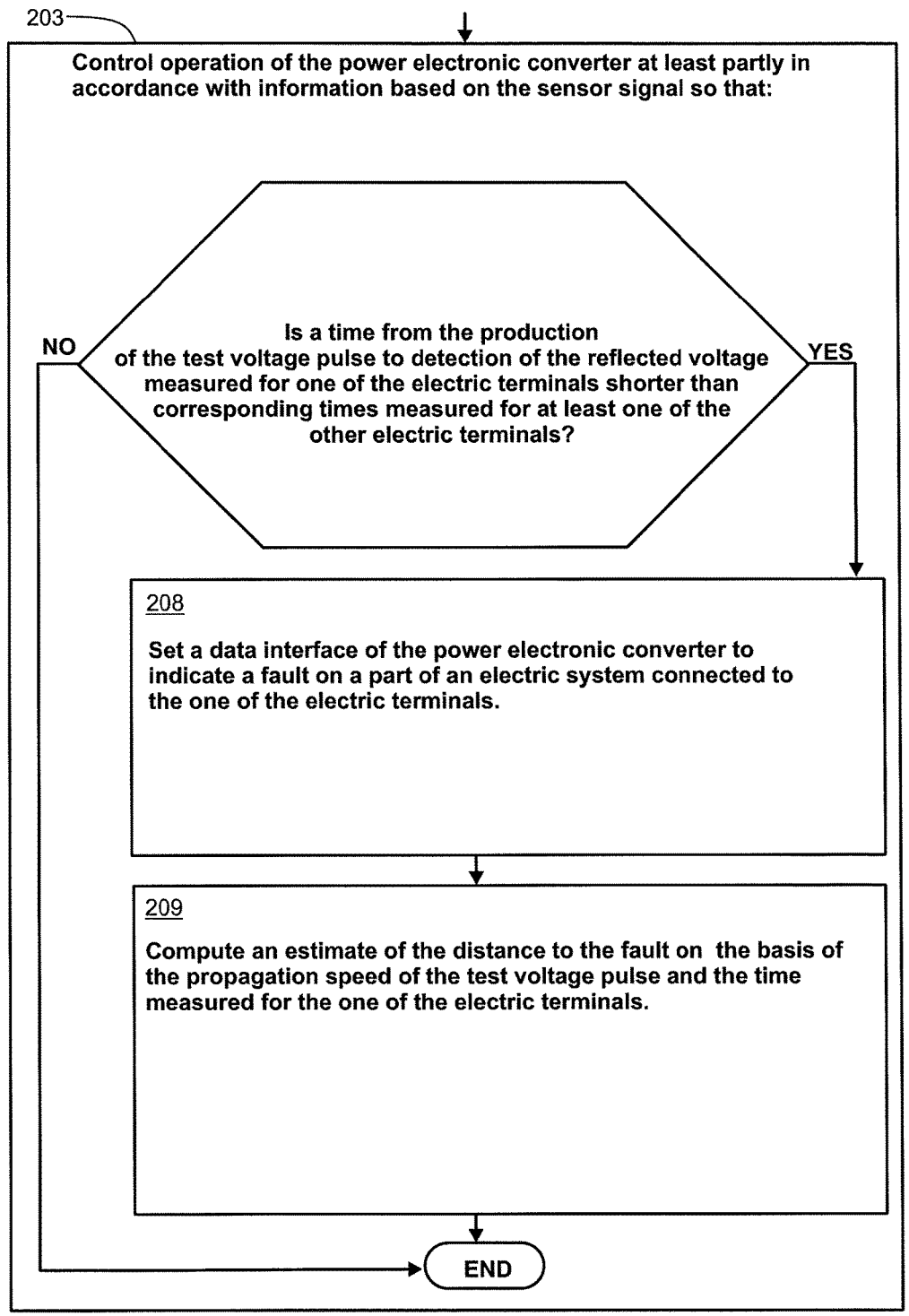
FIG. 2d shows a part of a flowchart of a method according to an exemplifying and non-limiting embodiment of the invention for controlling a power electronic converter.

In a method according to an exemplifying and non-limiting embodiment of the invention, the action 201 shown in FIG. 2a comprises controlling the controllable switches of the power electronic converter so as to produce test voltage pulses at different ones of the electric terminals of the power electronic converter and the action 203 shown in FIG. 2a comprises detecting differences between reflected voltages detected from the different ones of the electric terminals of the power electronic converter. FIG. 2d illustrates exemplifying sub-actions of the action 203:

sub-action 208: setting a data interface of the power electronic converter to indicate a fault on a part of the external electric system connected to a first one of the electric terminals of the power electronic converter in response to a situation in which a time measured from the production of the test voltage pulse at the first one of the electric terminals of the power electronic converter to the detection of the reflected voltage from the first one of the electric terminals of the power electronic converter is shorter than the corresponding time measured for at least one of the other electric terminals of the power electronic converter, and sub-action 209: computing an estimate for the distance from the power electronic converter to the fault on the basis of the time measured for the first one of the electric terminals of the power electronic converter and a pre-determined parameter indicative of the propagation speed of the test voltage pulses.

A computer program according to an exemplifying and non-limiting embodiment of the invention comprises computer executable instructions for controlling a programmable control system of a power electronic converter to carry out actions related to a method according to any of the above-described exemplifying embodiments of the invention.

A computer program according to an exemplifying and non-limiting embodiment of the invention comprises software modules for controlling a power electronic converter. The software modules comprise computer executable instructions for controlling a programmable control system of the power electronic converter to:

control one or more controllable switches of the power electronic converter so as to produce at least one test voltage pulse at electric terminals of the power electronic converter, receive a sensor signal indicative of a reflected voltage detected from the electric terminals of the power electronic converter, the reflected voltage arriving from an external electric system connected to the electric terminals of the power electronic converter and being caused by a reflection of the test voltage pulse, and control operation of the power electronic converter at least partly in accordance with information based on the sensor signal.

The above-mentioned software modules can be e.g. sub-routines or functions implemented with a suitable programming language and with a compiler suitable for the programming language and for the programmable control system under consideration. It is worth noting that also a source code corresponding to a suitable programming language represents the computer executable software modules because the source code contains the information needed for controlling the programmable control system to carry out the above-presented actions and compiling changes only the format of the information. Furthermore, it is also possible that the programmable control system is provided with an interpreter so that a source code implemented with a suitable programming language does not need to be compiled prior to running.

A computer program product according to an exemplifying and non-limiting embodiment of the invention comprises a computer readable medium, e.g. a compact disc "CD", encoded with a computer program according to an embodiment of invention for controlling a power electronic converter.

A signal according to an exemplifying and non-limiting embodiment of the invention is encoded to carry information defining a computer program according to an embodiment of invention for controlling a power electronic converter.

The specific examples provided in the description given above should not be construed as limiting the scope and/or the applicability of the accompanied claims. Lists and groups of examples provided in the description given above are not exhaustive unless otherwise explicitly stated.

What is claimed is:

1. A power electronic converter comprising:
electric terminals for connecting to an external electric system,
controllable switches connected to the electric terminals,
a control system for operating the controllable switches so as to control voltages of the electric terminals, and
a voltage sensor connected to the electric terminals,
wherein the control system is configured to:
control one or more of the controllable switches so as to produce at least one test voltage pulse at the electric terminals, receive, from the voltage sensor, a sensor signal indicative of a reflected voltage detected from the electric terminals, the reflected voltage arriving from the external electric system and being caused by a reflection of the test voltage pulse, and control operation of the power electronic converter at least partly in accordance with information based on the sensor signal.

2. The power electronic converter according to claim 1, wherein the control system is configured to measure a time from production of the test voltage pulse to detection of the reflected voltage and to control the operation of the power electronic converter at least partly in accordance with the measured time.

3. The power electronic converter according to claim 2, wherein the control system is configured to determine, on the basis of the measured time, allowed pulse widths for the voltages of the electric terminals.

4. The power electronic converter according to claim 3, wherein the control system is configured to determine the allowed pulse widths according to:

$$2N+1.5 < PW/T < 2N+2.5 \text{ or } PW/T \geq 4.5,$$

where T is the time measured from the production of the test voltage pulse to the detection of the reflected voltage, PW represents the allowed pulse widths, and N is zero or a positive integer.

5. The power electronic converter according to claim 1, wherein the control system is configured to set a data interface of the power electronic converter to indicate a fault on the external electric system in response to a situation in which a first arriving edge of the reflected voltage has an opposite polarity with respect to a polarity of the test voltage pulse.

6. The power electronic converter according to claim 5, wherein the control system is configured to compute an estimate of a distance from the power electronic converter to the fault on the basis of a pre-determined parameter indicative of propagation speed of the test voltage pulse and a time measured from production of the test voltage pulse to detection of the reflected voltage.

7. The power electronic converter according to claim 1, wherein the control system is configured to control the controllable switches so as to produce test voltage pulses at different ones of the electric terminals and to detect differences between reflected voltages detected from the different ones of the electric terminals.

8. The power electronic converter according to claim 7, wherein the control system is configured to set a data interface of the power electronic converter to indicate a fault on a part of the external electric system connected to a first one of the electric terminals in response to a situation in which a time measured from production of the test voltage pulse at the first one of the electric terminals to detection of the reflected voltage from the first one of the electric terminals is shorter than a corresponding time measured for at least one of other ones of the electric terminals.

9. The power electronic converter according to claim 8, wherein the control system is configured to compute an estimate of a distance from the power electronic converter to the fault on the basis of the time measured for the first one of the electric terminals and a pre-determined parameter indicative of propagation speed of the test voltage pulses.

10. An electric drive comprising:
an electric machine,
a power electronic converter according to claim 1, and
a cable between the electric machine and the power electronic converter.

11. A method comprising:
controlling one or more controllable switches of a power electronic converter so as to produce at least one test voltage pulse at electric terminals of the power electronic converter, receiving a sensor signal indicative of a reflected voltage detected from the electric terminals of the power electronic converter, the reflected voltage arriving from an electric system connected to the electric terminals of the power electronic converter and being caused by a reflection of the test voltage pulse, and controlling operation of the power electronic converter at least partly in accordance with information based on the sensor signal.

12. The method according to claim 11, wherein the method comprises measuring a time from production of the test voltage pulse to detection of the reflected voltage and controlling the operation of the power electronic converter at least partly in accordance with the measured time.

13. The method according to claim 12, wherein the method comprises determining, on the basis of the measured time, allowed pulse widths for voltages of the electric terminals of the power electronic converter.

14. The method according to claim 13, wherein the method comprises determining the allowed pulse widths according to:

$$2N+1.5 < PW/T < 2N+2.5 \text{ or } PW/T \geq 4.5,$$

where T is the time measured from the production of the test voltage pulse to the detection of the reflected voltage, PW represents the allowed pulse widths, and N is zero or a positive integer.

15. The method according to claim 11, wherein the method comprises setting a data interface of the power electronic converter to indicate a fault on the external electric system in response to a situation in which a first arriving edge of the reflected voltage has an opposite polarity with respect to a polarity of the test voltage pulse.

16. The method according to claim 15, wherein the method comprises computing an estimate of a distance from the power electronic converter to the fault on the basis of a pre-determined parameter indicative of propagation speed of the test voltage pulse and a time measured from production of the test voltage pulse to detection of the reflected voltage.

17. The method according to claim 11, wherein the method comprises controlling the controllable switches of the power electronic converter so as to produce test voltage pulses at different ones of the electric terminals of the power electronic converter and detecting differences between reflected voltages detected from the different ones of the electric terminals of the power electronic converter.

18. The method according to claim 17, wherein the method comprises setting a data interface of the power electronic converter to indicate a fault on a part of the external electric system connected to a first one of the electric terminals of the power electronic converter in response to a situation in which a time measured from production of the test voltage pulse at the first one of the electric terminals of the power electronic converter to detection of the reflected voltage from the first one of the electric terminals of the power electronic converter is shorter than a corresponding time measured for at least one of other ones of the electric terminals of the power electronic converter.

19. The method according to claim 18, wherein the method comprises computing an estimate of a distance from the power electronic converter to the fault on the basis of the time measured for the first one of the electric terminals of the power electronic converter and a pre-determined parameter indicative of propagation speed of the test voltage pulses.

20. A computer program comprising computer executable instructions for controlling a programmable control system of a power electronic converter to:
    control one or more controllable switches of the power electronic converter so as to produce at least one test voltage pulse at electric terminals of the power electronic converter,
    receive a sensor signal indicative of a reflected voltage detected from the electric terminals of the power electronic converter, the reflected voltage arriving from an external electric system connected to the electric terminals of the power electronic converter and being caused by a reflection of the test voltage pulse, and
    control operation of the power electronic converter at least partly in accordance with information based on the sensor signal.

21. The computer program product comprising a non-transitory computer readable medium encoded with a computer program according to claim 20.

\* \* \* \* \*